United States Patent [19]

Kuboyama et al.

[11] Patent Number: 4,539,178
[45] Date of Patent: Sep. 3, 1985

[54] INDIUM-ANTIMONY COMPLEX CRYSTAL SEMICONDUCTOR AND PROCESS FOR PRODUCTION THEREOF

[75] Inventors: Keiji Kuboyama; Takeki Matsui; Takeo Kimura, all of Shizuoka, Japan

[73] Assignee: Asahi Kasei Kogyo Kabushiki Kaisha, Osaka, Japan

[21] Appl. No.: 620,645

[22] Filed: Jun. 14, 1984

Related U.S. Application Data

[62] Division of Ser. No. 361,939, Mar. 25, 1982, Pat. No. 4,468,415.

[51] Int. Cl.$^3$ ............................................... B05D 5/12
[52] U.S. Cl. ..................................... 420/555; 148/400; 148/442; 420/576; 420/580; 428/600
[58] Field of Search ....................... 420/555, 576, 580; 148/400, 442; 428/600

[56] References Cited

U.S. PATENT DOCUMENTS

| | | | |
|---|---|---|---|
| 3,101,280 | 8/1963 | Harrison | 420/576 |
| 3,634,143 | 1/1972 | Brennan | 420/555 |
| 3,850,685 | 11/1974 | Sakai | 420/555 |
| 4,213,781 | 7/1980 | Noreika | 420/555 |

Primary Examiner—Peter D. Rosenberg
Attorney, Agent, or Firm—Sughrue, Mion, Zinn, Macpeak, and Seas

[57] ABSTRACT

An indium-antimony complex crystalline semiconductor consisting essentially of crystals of an indium-antimony compound and crystals of indium alone is disclosed. The atomic ratio of the total indium content to the antimony content in the semiconductor is in the range of from 1.1/1 to 1.7/1. A process for producing such semiconductor is also disclosed. In the process, the vapors of indium and antimony are deposited on a substrate in such a manner that the arrival rate ratio of indium to antimony is controlled to be within the range of from 1.1/1 to 1.7/1.

4 Claims, 5 Drawing Figures

INDIUM-ANTIMONY COMPLEX CRYSTAL SEMICONDUCTOR AND PROCESS FOR PRODUCTION THEREOF

This is a Division of application Ser. No. 06/361,939, filed Mar. 25th, 1982, U.S. Pat. No. 4,468,415.

FIELD OF THE INVENTION

The present invention relates to a new indium-antimony complex crystal semiconductor and a process for producing the same. More particularly, the present invention relates to a new indium-antimony complex crystal semiconductor, a thin film of which exhibits properties suitable for use as a Hall element or magnetoresistive element, and a process for producing such semiconductor.

BACKGROUND OF THE INVENTION

A thin film of indium-antimony compound has a higher mobility (78,000 cm$^2$/V·sec) than other semiconductor compounds, such as an indium-arsenic compound (30,000 cm$^2$/V·sec) and gallium-arsenic compound (7,000 cm$^2$/V·sec). Because of this property, a thin film of indium-antimony compound is known to be advantageous for use as a Hall element or magnetoresistive element, and has been getting the increasing attention of researchers as a device that can be used in a position detector for a direct drive motor, or as a component of video tape recorder or acoustic equipment.

Figure 1:
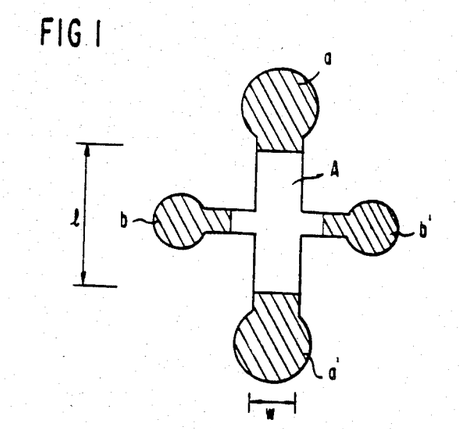
FIG. 1 is a pattern for measuring the electrical characteristics of a semiconductor.

Two important parameters for the Hall effect of a semiconductor are the Hall coefficient ($R_H$) and Hall mobility ($\mu_H$). FIG. 1 shows an arrangement for measurement of these two parameters, which consists of a test conductor A having a length l, width w, and a thickness t (not illustrated), on which gold is vacuum-deposited to form input electrodes a, a' and output electrodes b, b'. A voltage $V_{Hi}$ is developed between the output electrodes when the input electrodes are connected to a constant current supply I, and a voltage $V_{Hv}$ is developed when they are connected to a constant voltage supply V. The two voltages are represented by the following equations:

$$V_{Hi} = (R_H BI/t) \cdot f \quad (1)$$

$$V_{Hv} = (\mu_H BV/t) \cdot (w/l) \cdot f \quad (2)$$

wherein B is the magnetic flux density of an external magnetic field applied, and f is a factor dependent on the configuration of the sample. As equation (1) shows, $V_{Hi}$ is in inverse proportion to the thickness of the material through which the current flows, and it can be seen that the thickness of an indium-antimony wafer to be used as a high-sensitivity Hall element or magnetoresistive element should be as small as possible. Since the indium-antimony semiconductor has a small forbidden band, its Hall coefficient ($R_H$) in equation (1) varies greatly with temperature, and $V_{Hi}$, the output voltage under constant current, is largely dependent on temperature in practical applications. On the other hand, the Hall mobility ($\mu_H$) in equation (2) is fairly independent with respect to temperature and almost all commercial indium-antimony Hall elements are used under constant voltage. Hence, an indium-antimony semiconductor having high Hall mobility rather than high Hall coefficient is desired. However, no industrial process has to date been known for producing a thin film of indium-antimony crystalline structure.

Heretofore, it has been considered essential that in a compound semiconductor such as indium-antimony, the atomic ratio of the element of group IIIB in the Periodic Table to the element of group VB should be 1/1 (see Z. Naturforschung, Vol. 7a, p. 744, 1952). To make a wafer of indium-antimony crystal having an In to Sb atomic ratio of 1/1 for use as a Hall element or magnetoresistive element, a slice of a single crystal of indium-antimony is polished into a thin film, or an indium-antimony composition having a thickness of about 10 μm layer is formed on a substrate by vacuum deposition or other suitable means, crystallized by zone melting and then polished to a thin film (see Japanese Patent Application (OPI) No. 9373/75 (the term "OPI" as used herein refers to a "published unexamined Japanese patent application")). However, slicing a wafer of InSb single crystal is not an industrially advantageous method, since a large amount of expensive material must be used. In the second method wherein the vacuum-deposited InSb layer is crystallized, controlling the In to Sb atomic ratio at 1/1 is very difficult and requires complex procedures, and these are two great limiting factors on the effort to use this method on an industrial scale. K. G. Günther proposed in U.S. Pat. No. 3,172,778 a process for making a thin layer of IIIB-VB compound semiconductor by vacuum deposition. In that process, Günther suggests presetting the temperature of the substrate higher than the decomposition temperature of the compound semiconductor, and depositing more element of VB group than the element of IIIB by controlling the arrival rate ratio of the two elements (hereunder referred to as $A_{In}/A_{Sb}$) to be 1 or less. The arrival rate ratio ($A_{In}/A_{Sb}$) as used herein means the ratio of the flux density of In atoms to that of Sb atoms that reach the substrate in the process of vacuum deposition (see Physics Status Solid, (a), Vol. 54, p. 707, 1979). But even this method requires a complex procedure to control the atomic ratio of In to Sb to be 1.0/1 and has the above described defects of the conventional art.

Noting that in the prior art the problem in producing a thin film of indium-antimony semiconductor is the necessity of strictly controlling the In to Sb atomic ratio, and that therefore the process control can be simplified and hence the desired thin film can be easily produced by expanding the latitude in selection of the In to Sb atomic ratio, the present inventors have conducted various studies to develop an industrial process for making a thin film of indium-antimony crystalline structure.

SUMMARY OF THE INVENTION

One object of the present invention is to provide an indium-antimony complex crystalline semiconductor having high crystallinity and high mobility.

Another object of the present invention is to provide a thin film of indium-antimony complex crystalline semiconductor, which exhibits properties suitable for use as a Hall element or magnetoresistive element.

Still another object of the present invention is to provide a process for producing an indium-antimony complex crystalline semiconductor and a thin film thereof, which is free from the above problems on an industrial scale.

Other objects of the present invention will be apparent from the description hereinbelow.

As a result of extensive studies, it has now unexpectedly been found that an indium-antimony compound that has an excess of indium, and particularly which has an In to Sb atomic ratio in the range of from 1.1/1 to 1.7/1 has high crystallinity and exhibits high mobility. This fact disproves the established theory in the art. It has also been found that such compound can be produced easily by depositing the vapor of antimony and indium on a substrate under such conditions that the $A_{In}/A_{Sb}$ (arrival rate ratio) is from 1.1/1 to 1.7/1. The inventors made further studies to devise an improved process for providing the indium-antimony complex crystalline semiconductor with even higher mobility, and found that a superior complex crystalline semiconductor having much higher mobility can be produced by controlling the temperature of the substrate by reference to the pressure in the vacuum deposition system. The present invention has been accomplished on these findings.

DETAILED DESCRIPTION OF THE INVENTION

Specific embodiments of the present invention are listed below:

(1) An indium-antimony complex crystalline semiconductor consisting essentially of crystals of an indium-antimony compound and crystals of indium alone, wherein the atomic ratio of total indium to antimony is in the range of from 1.1/1 to 1.7/1.

(2) A thin film of the indium-antimony complex crystalline semiconductor as in (1).

(3) A process for producing an indium-antimony complex crystalline semiconductor consisting essentially of crystals of an indium-antimony compound and crystals of indium alone by depositing the vapors of indium and antimony on a substrate in such a manner that $A_{In}/A_{Sb}$ is controlled to be within the range of from 1.1/1 to 1.7/1.

(4) A process as in (3) wherein the temperature of the substrate is held in the initial period of the vacuum deposition at a level lower than the limiting temperature given by the formula $$1/T_L = 9.98 \times 10^{-4} - 5.66 \times 10^{-5} \log P$$

wherein $T_L$ is the limiting temperature of the substrate on the absolute scale (°K.), and P is the pressure in the vacuum deposition system (expressed in Torrs).

(5) A process as in (4) wherein the $A_{In}/A_{Sb}$ is held at 1.0/1 or below in the initial stage of the vacuum deposition, and, at the same time, the temperature of the substrate (T) is held at a level that satisfies the relation $Tc \leq T \leq Tc + 30$, wherein Tc is the critical temperature of the substrate on the absolute scale (°K.) that is given by the formula $$1/Tc = 1.29 \times 10^{-3} - 3.84 \times 10^{-5} \log P$$

wherein P is the pressure in the vacuum deposition system (expressed in Torrs).

(6) A process as in (3), wherein the vacuum deposition is performed in the presence of nitrogen.

The essential feature of the present invention is to provide an indium-antimony complex crystalline semiconductor wherein the atomic ratio of total indium, i.e., indium in the In-Sb compound and indium as the indium crystal, to antimony (or film composition ratio of indium to antimony which is hereunder referred to as $F_{In}/F_{Sb}$) is in the range of from 1.1/1 to 1.7/1, as well as a process for producing such semiconductor. This feature of the present invention is entirely unexpected from the state of the art.

Figure 2:
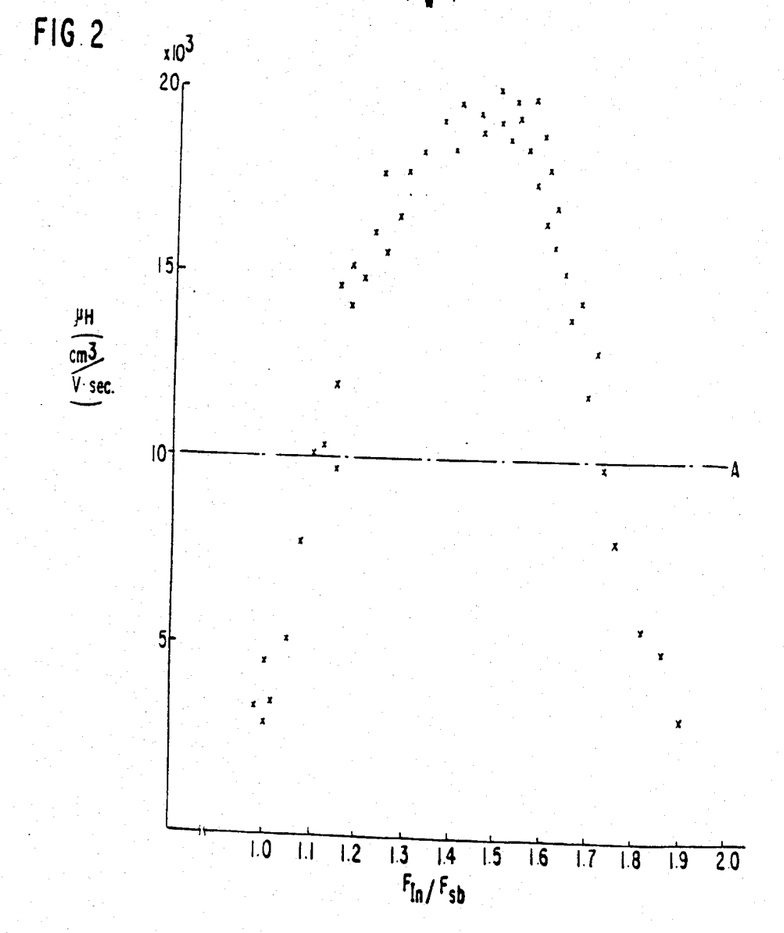
FIG. 2 is a graph showing the relation between $F_{In}/F_{Sb}$ (defined below) and Hall mobility of the thin semiconducting films made in Example 1.

For the purposes of the present invention, the value of $F_{In}/F_{Sb}$ of the indium-antimony complex crystalline semiconductor must be in the range of from 1.1/1 to 1.7/1 because the semiconductor having a value of $F_{In}/F_{Sb}$ in this range exhibits a particularly higher mobility than those which have a value outside this range, and it is easier to make a thin film thereof that suits practical purposes. The relation between the $F_{In}/F_{Sb}$ and mobility of a thin semiconducting film is shown in FIG. 2, wherein the $F_{In}/F_{Sb}$ is plotted on the x-axis and a fairly accurate measurement of the factor could be made by atomic absorption spectroscopy. The mobility of the thin film is plotted on the y-axis. In FIG. 2, the symbol A indicates a line for the mobility of 10,000 cm$^2$/V·sec, and the region above this line is practical. The thin film has a mobility higher than this line when it has a value of $F_{In}/F_{Sb}$ between 1.1/1 and 1.7/1. If the value of $F_{In}/F_{Sb}$ is less than 1.1/1, the resulting thin film is fragile and has a high noise level. If the $F_{In}/F_{Sb}$ is above 1.7/1, a heterogeneous thin film is made and the commercial productivity of the film is decreased. A particularly preferred range is from 1.2/1 to 1.6/1. If this range is observed, a highly crystalline thin film having high mobility and uniformity, and yet which has a low noise level, is produced. As described above, the complex crystalline semiconductor of the present invention has an excess of indium, and the indium content is variable over a fairly wide range. Therefore, the desired thin film can be produced by an industrially efficient technique of vacuum deposition since there is no need of using excess antimony having high vapor pressure and yet there is an increased latitude in selection of process conditions.

Figure 3:
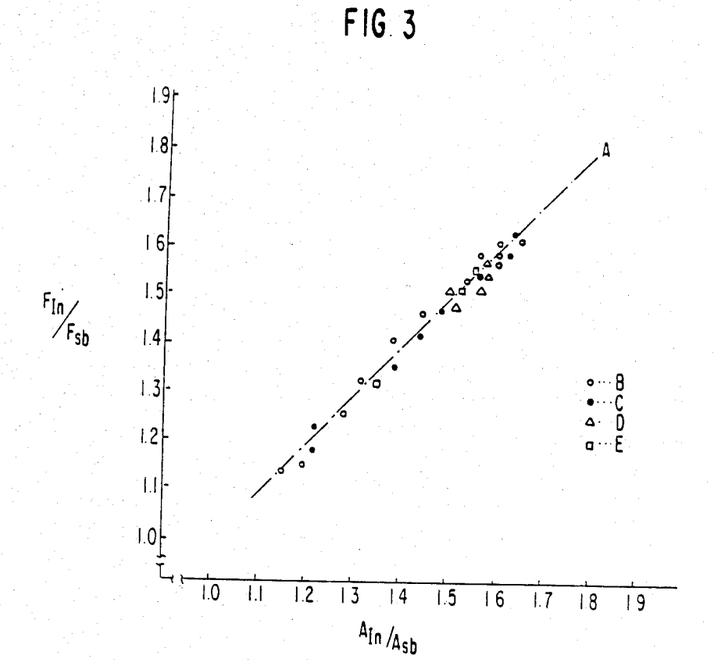
FIG. 3 is a graph showing the relation of $A_{In}/A_{Sb}$ and $F_{In}/F_{Sb}$.

The process of the present invention is based on the new finding that if the $F_{In}/F_{Sb}$ is in the range of from 1.1/1 to 1.7/1, it agrees substantially with the value of $A_{In}/A_{Sb}$, the difference being within experimental error. The process of the present invention that produces a thin film of indium-antimony complex crystalline semiconductor that is very rich in indium is based on the idea of controlling the value of $A_{In}/A_{Sb}$ to be within the range of from 1.1/1 to 1.7/1, and this idea is very much different from the established theory. FIG. 3 shows how the value of $F_{In}/F_{Sb}$ agrees with that of $A_{In}/A_{Sb}$. In FIG. 3, the $A_{In}/A_{Sb}$ is plotted on the x-axis and the $F_{In}/F_{Sb}$ is plotted on the y-axis. In FIG. 3, the symbol A represents a line for $F_{In}/F_{Sb} = A_{In}/A_{Sb}$, B represents a case for a substrate temperature of 440° C., C represents a case for a substrate temperature of 350° C., D represents a case for a substrate temperature of 460° C., and E represents a case for a substrate temperature of 400° C. The values of $A_{In}/A_{Sb}$ could be determined by a simple preliminary experiment: first, the relation between the amounts of indium and antimony that were vaporized from their respective boats and the amounts of their vapor deposited on the substrate was determined for the case where the temperature of the substrate was low, say, at room temperature; the flux density of the respective atoms could be determined from the amounts of deposition, and hence, the relation between the amounts of the respective elements that were vaporized from the boats and their flux densities could be determined. The points in FIG. 3 relate the $F_{In}/F_{Sb}$ and $A_{In}/A_{Sb}$ to the actual temperatures at which thin In-Sb complex crystalline films were made. As is clear from FIG. 3, the values of $A_{In}/A_{Sb}$ substantially agree with those of $F_{In}/F_{Sb}$ within the range contemplated by the present invention where the $F_{In}/F_{Sb}$ is between 1.1/1 and 1.7/1, so the composition of the thin film produced can be controlled by controlling the $A_{In}/A_{Sb}$. Since the $A_{In}/A_{Sb}$ can be controlled simply by controlling the amounts of the respective elements that are vaporized from their boats, the process of the present invention is very useful for industrial purposes. Furthermore, the variation in the mobility of the thin film produced can be reduced to a surprisingly low level by holding the $A_{In}/A_{Sb}$ constant. Therefore, the greatest industrial advantage of the present invention is that it provides a process for making a thin film of indium-antimony complex crystalline semiconductor having the least variation in its characteristics.

A thin film of indium-antimony complex crystalline semiconductor having a further increased mobility can be produced if the temperature of the substrate is held in the initial stage of vacuum deposition to be at a level lower than the limiting temperature of the substrate given by the formula $$1/T_L = 9.98 \times 10^{-4} - 5.66 \times 10^{-5} \log P \quad (3)$$

wherein $T_L$ is the limiting temperature of the substrate on the absolute scale, and P is the pressure in the vacuum deposition system (expressed in Torrs).

The term "initial stage" used herein means the initial period until the film having a thickness of about 1,000 Å is formed. When the final film having a relatively large thickness (e.g., $2\mu$ or more) is desired, it is preferred that the initial stage be extended to form the film having a thickness of about 2,000 Å.

As described hereinafter, the limiting substrate temperature $T_L$ given by the formula (3) corresponds to the decomposition point of the crystal of an indium-antimony compound, and according to the studies of the present inventors, the substrate temperature is desirable held in the initial stage of vacuum deposition at a level at least 20° C. lower than this decomposition point. When a thin film is formed by vacuum deposition, the substrate temperature becomes higher than the preset level, and even in such a case, the substrate temperature must be held below the melting point of the In-Sb compound which is about 530° C. For this purpose, the substrate temperature may be increased continuously at a given rate, or it may be elevated incrementally (stepwise). As indicated by the formula (3), the limiting temperature of the substrate is dependent on the pressure, and it is a temperature at which the amounts of deposition of indium and antimony vapors are decreased suddenly for the unit amount of vaporization (the amounts of indium and antimony vaporized from their boats) per given area. Therefore, the limiting substrate temperature can be defined as the temperature of the substrate at which the ratio of deposition to vaporization is decreased suddenly for a given degree of vacuum.

Figure 4:
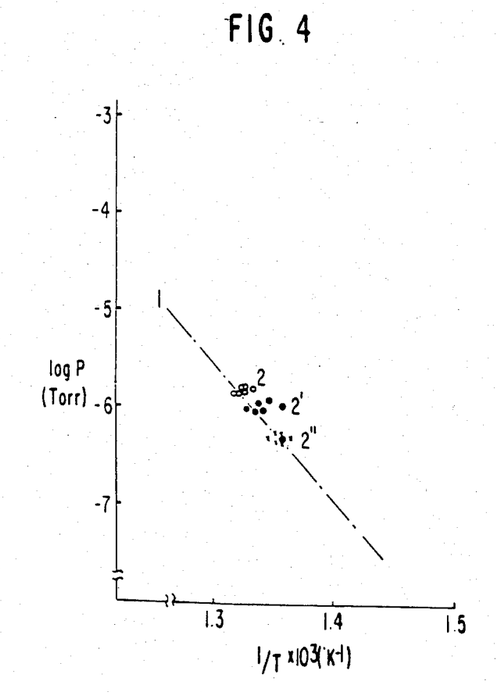
FIG. 4 is a graph showing the relation between the pressure (degree of vacuum) in a vacuum deposition system and the limiting temperature of the substrate.

The present inventors studied the relation between the limiting substrate temperature and the pressure, and obtained the results shown in FIG. 4, wherein the logarithm of pressure is plotted on the y-axis and the reciprocal of the substrate temperature is plotted on the x-axis. In FIG. 4, the straight line 1 is the theoretical decomposition line given by the formula (3), and the numerals 2, 2' and 2" represent sets of experimental values that are obtained at different pressures. One can easily see that these experimental values are virtually on the theoretical decomposition line. The present inventors have found that these values well coincide with the theoretical curve of the decomposition of an indium-antimony compound that is very similar to the formula (3) and which is calculated on the basis of the thermal data for In-Sb compound prepared by Lichter et al (see *Trans. Metallurgical Soc.*, AIME Vol. 245, p. 99, 1969) and the thermal data for the elements prepared by Stull et al (see *Thermodynamic Properties of the Elements,* ACS, 1956). In other words, for a given degree of vacuum in the vacuum deposition system, the limiting substrate temperature substantially corresponds to the decomposition point. Therefore, the process of this embodiment differs essentially from the "three-temperature method" proposed by Günther. In the three-temperature method, $A_{In}/A_{Sb}$ is held at 1.0/1 or below, and, at the same time, the substrate temperature must be held higher than the decomposition point of the In-Sb compound, but in the process of this embodiment, $A_{In}/S_b$ is held between 1.1/1 and 1.7/1, and at the same time the substrate temperature in the initial period of vacuum deposition is held below the decomposition point of the In-Sb compound. If the vapors of indium and antimony are deposited on the substrate at an $A_{In}/A_{Sb}$ between 1.1/1 and 1.7/1 by presetting the substrate temperature higher than the decomposition point of the In-Sb compound semiconductor, a non-glossy and non-uniform film having pinholes results, and, what is worse, the mobility, which is an important factor of the resulting film, is only 10,000 cm$^2$/V·sec or less.

Formula (3) also indicates that the limiting temperature of the substrate can be varied by changing the degree of vacuum. To be more specific, the degree of vacuum may be reduced if the substrate temperature need be preset at a high level. The degree of vacuum may be reduced by holding down the performance of the evacuating system used, or by introducing a gas into the vacuum deposition system through a needle valve or the like. Nitrogen, argon, hydrogen, helium and many other gases can be used, but according to the studies of the present inventors, a thin film having a remarkably high mobility can preferably be obtained by using nitrogen.

The inventors therefore conducted a close study on the gas to be introduced in the vacuum deposition system, and found the following: (1) rare gases such as argon and helium decrease, rather than increase, the mobility; (2) if nitrogen is supplied in an amount that is greater than its content in atmosphere, higher mobility is obtained. The amount of nitrogen relative to other gases varies with the degree of vacuum achieved at the start of vacuum deposition and that achieved by introduction of nitrogen. For instance, if the initial degree of vacuum which is $10^{-6}$ Torr is reduced to $5 \times 10^{-6}$ Torr by supplying nitrogen, the nitrogen content is about 90 mol%. Surprisingly enough, such a small change in the composition of the atmosphere in the vacuum deposition system (from 80 mol% of nitrogen that is the nitrogen content of air to 90 mol%) is sufficient to provide the desired improvement in mobility. In other words, the mobility can be increased significantly by using an atmosphere for vacuum deposition whose nitrogen content is greater than 80%, the nitrogen content of air. But if the nitrogen content is less than 80 mol%, the mobility is not improved at all, and it is even decreased depending on the amounts of other gases contained in the vacuum deposition atmosphere. Several methods can be used to increase the nitrogen content of the vacuum deposition atmosphere. In one method, the system is evacuated in an adequately high degree of vacuum, then nitrogen is introduced, and the system is again evacuated to a high degree of vacuum. In another method, a nitrogen supply valve is connected to the vacuum deposition equipment, and the initial degree of vacuum of the system is reduced by supplying a small amount of nitrogen. A preferred method is to first increase the degree of vacuum up to $10^{-7}$ Torr, then supply nitrogen to obtain a pressure of $10^{-5}$ Torr, and perform the vacuum deposition with the supply of nitrogen continued. A thin film of indium-antimony complex crystalline semiconductor having an even higher mobility can be produced in a nitrogen-rich atmosphere by depositing the vapors of indium and antimony on a substrate that is held in the initial stage of the deposition at a level lower than the limiting substrate temperature given by the formula (3).

When it is desired to provide the thin film of indium-antimony complex crystalline semiconductor of the present invention with a mobility as high as that of a bulk device, $A_{In}/A_{Sb}$ must be held at 1.0/1 or lower in the initial stage of vacuum deposition and at the same time, the substrate temperature (T) must be preset at a level that satisfies the relation $$Tc \leq T \leq Tc + 30 \qquad (4)$$

wherein Tc is the critical temperature of the substrate on the absolute scale that is given by the formula $$1/Tc = 1.29 \times 10^{-3} - 3.84 \times 10^{-5} \log P \qquad (5)$$

wherein P is the pressure in the vacuum deposition system (expressed in Torrs).

The formulae (4) and (5) are empirical formulae that show the relation between the preset temperature of the substrate and the degree of vacuum for producing a thin semiconducting film having a very high mobility. As far as the present inventors know, the formula (5) corresponds to the equilibrium vaporization temperature (Tv) of $Sb_4$ with a degree of vacuum in the range of from $10^{-6}$ to $10^{-3}$ Torr. It is believed that the formula slightly differs from, but substantially corresponds to, the value calculated from the thermal data for the elements prepared by Stull et al. (*Thermodynamic Properties of the Elements*, ACS, 1956). Formula (4) allows some variation in the preset value of the substrate temperature because said value must be varied depending upon the position of the monitor for the substrate temperature or the degree of vacuum, as well as upon the vacuum deposition rate. In this case, the value of $A_{In}/A_{Sb}$ in the initial stage of the vacuum deposition must be held at 1.0/1 or lower. But it is absolutely necessary that the average value of $A_{In}/A_{Sb}$ be maintained between 1.1/1 and 1.7/1 throughout the process of vacuum deposition. The particularly preferred average value of $A_{In}/A_{Sb}$ is between 1.1/1 and 1.5/1.

The studies of the present inventors have shown that it is essential for the purpose of making a thin film of In-Sb semiconductor having a very high mobility that the value of $A_{In}/A_{Sb}$ be held in the initial stage of vacuum deposition to be at 1.0/1 or below. The inventors made a series of experiments in which vacuum deposition was conducted by controlling the power supplied to indium and antimony boats for achieving a mobility as high as that of a bulk device and the deposition was stopped in a few minutes. The inventors found that in every experiment, the value of $A_{In}/A_{Sb}$ was 1.0/1 or less, and in an extreme case, the value was less than 0.5/1. However, the requirement of holding the value of $A_{In}/A_{Sb}$ to be 1.0 or less applies only to the initial period of vacuum deposition during which a semiconducting film having a thickness of 1,000 Å is formed. If the value of $A_{In}/A_{Sb}$ is held at 1.0/1 or lower in the subsequent stage, the resulting film is very brittle and has a very low mobility.

If the above two requirements for the substrate temperature and $A_{In}/A_{Sb}$ are met, a thin film of indium-antimony complex crystalline semiconductor is produced wherein both the crystal of indium-antimony compound and the indium crystal have grown to a size visible to the naked eye. If the substrate temperature in the initial stage of vacuum deposition is lower than the critical substrate temperature, the resulting crystal is not visible to the naked eye at all, or only a blue-white film is formed. If the substrate temperature is higher than the upper limit specified by the formula (4), some of the crystal grains formed are visible but there occurs a variation is not only the mobility but also the film thickness, or a transparent area is formed in the film. If vacuum deposition is performed by the process of this embodiment, the resulting thin film of indium-antimony complex crystalline semiconductor has a mobility as high as that of a bulk device and the crystal grains formed are visible to the naked eye. It is very surprising that this film has a value of $F_{In}/F_{Sb}$ in the range of from 1.1/1 to 1.7/1.

The compound semiconductor of the present invention has a high Hall mobility and is very suitable for use as the material of a Hall element or magnetoresistive element. In this connection, it should be remembered that the formula (1) shows the desirability of making a thin film of the semiconductor if it is used in a Hall element or magnetoresistive element. For this purpose, the compound semiconductor of the present invention is made in a thin film whose thickness is preferably from 5,000 Å to 10 $\mu$m, more preferably from 0.8 to 5.0 $\mu$m. The thinner the film, the greater the output voltage produced, but, on the other hand, an excessively thin film has low mobility.

According to the process of the present invention, a thin film of high-mobility indium-antimony complex crystalline semiconductor having a value of $F_{In}/F_{Sb}$ of from 1.1/1 and 1.7/1 can be produced by depositing the vapors of indium and antimony on a substrate under such conditions that the value of $A_{In}/A_{Sb}$ is held in the range from 1.1/1 to 1.7/1. This method is advantageous in that it can be performed on an industrial scale such more easily than the conventional method of making an indium-antimony crystalline compound having an $A_{In}/A_{Sb}$ of 1.0/1, and that it is capable of producing a thin semiconducting film that has high mobility and which yet has a very small variation in the composition and characteristics of the film.

There is no particular limitation on the substrate that can be used in the process of the present invention, but an electrically insulating substrate is preferred, and an insulating crystalline substrate is particularly preferred. Illustrative substrates include silica glass, borosilicate glass, sodium glass, sapphire, calcium fluoride, sodium chloride and mica, and sapphire, calcium fluoride, sodium chloride and mica are particularly preferred. Mica is advantageous since it is fairly easily available and is completely insulating single crystal that easily forms a cleavage plane with minimum contamination or defect.

The process of the present invention can be performed by any of the known techniques that comply with the purposes of the present invention. Suitable examples are vacuum deposition by heating with an electric heater, electron beams, by flash evaporation, sputtering, molecular beam epitaxy and by ion beam plating. The rate of forming a thin film can be selected from a fairly wide range, i.e., from 0.1 to 1,000 Å/sec, but for easy control of the $A_{In}/A_{Sb}$, the rate of 1 to 10 Å/sec is particularly advantageous. The substrate may be heated to any temperature if the relation $A_{In}/A_{Sb} = F_{In}/F_{Sb}$ is satisfied, and it is generally heated to 530° C. or less. The vapor deposition temperature seems to have some relation with the pressure in the evaporation equipment, and, generally, the lower the pressure, the lower the maximum temperature for vapor deposition. The optimum source of evaporation is elemental indium and antimony. The power supplied to the respective boats may be so controlled that the ratio of evaporation of indium to antimony provides an $A_{In}/A_{Sb}$ between 1.1/1 and 1.7/1. Therefore, an antimony-containing compound such as InSb or GaSb may be used as an antimony source. Such compounds can be satisfactorily used as an antimony source since the vapor pressure of indium or gallium is much lower than that of antimony.

Figure 5:
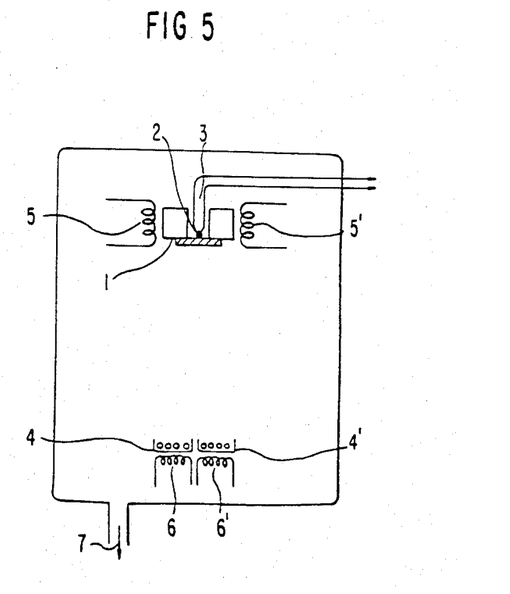
FIG. 5 is an illustration of an apparatus for use in producing the thin semiconducting film of the present invention.

FIG. 5 is a schematic representation of an apparatus suitable for use in producing the indium-antimony complex crystalline semiconductor of the present invention. In FIG. 5, the temperature of a substrate (e.g., mica plate) denoted as 1 is detected by a thermocouple 3 attached to the substrate through an indium material 2, and is held constant by a substrate temperature control system (not shown). The substrate 1 is heated to a predetermined temperature by heating elements 5, 5', and boats 4, 4' are heated to a predetermined temperature by heating elements 6, 6'. The boats 4, 4' are charged with elemental indium and antimony. Thereafter the apparatus is evacuated with a vacuum suction system 7 to a pressure of $10^{-3}$ to $10^{-6}$ Torr. By heating the boats 4, 4' to a higher temperature, the desired thin film of InSb complex crystalline semiconductor is formed on the substrate 1.

The thus-prepared thin film of InSb complex crystalline semiconductor of the present invention can be fabricated into a semiconductor device such as a Hall element or magnetoresistive element by, optionally pasting or transferring the film onto another substrate such as ferrite, patterning and connection to electrodes.

The present invention is now described in greater detail by reference to the following examples and comparative examples which are given here for illustrative purposes only, and are not intended to limit its scope.

The electric characteristics of the thin semiconducting films made in the following examples and comparative examples were measured by applying a constant current of 5 mA, a constant voltage of 1 V, and magnetic field of 500 gauss to films that were shaped as shown in FIG. 1 (length: 10 mm, width: 5 mm).

The composition of the crystal grains was analyzed by the wet process of atomic absorption spectroscopy, wherein a predetermined amount of the thin film was dissolved in dilute nitric acid and the light absorbance of the indium and antimony in that solution was measured with an atomic absorption spectroscope (Model AA-646 of Shimadzu Seisakusho, Ltd.).

In the analysis, calibration curves were depicted using two separate solutions of indium and antimony, and on the basis of those curves, the value of $F_{In}/F_{Sb}$ was calculated from the measured values of light absorbance.

EXAMPLE 1

Forty-eight thin films of indium-antimony complex crystalline semiconductor having a thickness between 1.0 and 2.0 μm and varying values of $F_{In}/F_{Sb}$ were made by depositing controlled amounts of the vapors of indium (6-N of Furuuchi Chemical Co., Ltd.) and antimony (6-N of the same company) onto a mica substrate in the apparatus of FIG. 5. The substrate temperature was 420° C., the degree of vacuum, 2.0 to $3.0 \times 10^{-6}$ Torr, and the deposition rate, 1.0 to 3.0 Å/sec. The electric characteristics and $F_{In}/F_{Sb}$ of the respective samples were measured, and the result is shown in FIG. 2 as a graph depicting the relation between $F_{In}/F_{Sb}$ and Hall mobility ($\mu_H$) in cm$^2$/V·sec. As one can see from the graph of FIG. 2, a maximum mobility of 20,100 cm$^2$/V·sec was obtained when the $F_{In}/F_{Sb}$ was 1.44/1, and the Hall coefficient was 346 cm$^3$/C. In the $F_{In}/F_{Sb}$ range of from 1.1/1 to 1.7/1, the mobility was between 9,500 and 20,100 cm$^2$/V·sec, and the Hall coefficient was between 254 and 346 cm$^3$/C.

Analysis of each film with an X-ray diffractometer showed the presence of two peaks for an indium-antimony compound and elemental indium, and they were found to have high degree of selective orientation. Further, Laue photographs of each film revealed that those having a value of $F_{In}/F_{Sb}$ in the range of from 1.1/1 to 1.7/1 had no ring characteristic of polycrystals and hence were found to have high degree of crystalline orientation. But those films which had values of $F_{In}/F_{Sb}$ outside this range had the characteristic ring. This data shows that the semiconductor of the present invention formed thin semiconducting films having high crystallinity.

EXAMPLE 2

Thin films of indium-antimony complex crystalline semiconductor having values of $F_{In}/F_{Sb}$ in the range of from 1.31/1 to 1.48/1 were prepared as in Example 1 except that the mica substrate was replaced by a glass plate (Corning 7059). The Hall mobilities of the films were in the range of from 2,700 to 5,500 cm$^2$/V·sec.

COMPARATIVE EXAMPLE 1

Three thin films of indium-antimony complex crystalline semiconductor having $F_{In}/F_{Sb}$ values of 0.98/1, 1.03/1 and 1.82/1, respectively, were prepared as in Example 1 except that a glass plate (Corning 7059) was used as substrate. The films had the Hall mobilities of 1,200, 1,900 and 1,700 cm$^2$/V·sec, respectively.

EXAMPLE 3

Seven thin films of indium-antimony complex crystalline semiconductor were prepared by depositing the vapors of indium and antimony (both being 6-N of Furuuchi Chemical Co., Ltd.) on a mica substrate in the apparatus of FIG. 5 wherein both the substrate and the respective boats were heated with a tungsten heater and the temperature of the substrate was held at 440° C. by proportional, integral and differential control. The degree of vacuum in the vapor deposition system was preset at $1.5 \times 10^{-6}$ Torr, the boats were charged with the same amounts of indium and antimony for the seven films so that the $A_{In}/A_{Sb}$ value was 1.45/1, and the power supplied to the boats was so controlled that the film thickness became 1 micron in 30 minutes. Each film was analyzed for its composition by subjecting part of each film to atomic absorption spectroscopy. The seven films had values of $F_{In}/F_{Sb}$ in the range of from 1.42/1 to 1.49/1. There was little variation in the Hall mobility of the seven films: the respective values were within the range of from 20,000 to 21,500 cm$^2$/V·sec. Additional three groups of seven thin semiconducting films were prepared as in above except that the amounts of indium and antimony were so changed that the values of $A_{In}/A_{Sb}$ were 1.15/1, 1.3/1 and 1.6/1, respectively. The composition analysis and mobility data for the films of the respective groups are indicated in Table 1 below.

TABLE 1

| $A_{In}/A_{Sb}$ | $F_{In}/F_{Sb}$ | Mobility (cm$^2$/V · sec) |
|---|---|---|
| 1.15/1 | 1.10/1–1.20/1 | 14,700–15,500 |
| 1.3/1 | 1.26/1–1.32/1 | 17,800–19,200 |
| 1.6/1 | 1.51/1–1.67/1 | 16,700–18,100 |

For comparison, thin semiconducting films were prepared by controlling the value of $A_{In}/A_{Sb}$ to be at 0.9/1 and 1.8/1. As shown in Table 2 below, there was not a high degree of agreement between $A_{In}/A_{Sb}$ and $F_{In}/F_{Sb}$, the films had low values of mobility, and there was great variation in the mobility. What is more, the films prepared by controlling the $A_{In}/A_{Sb}$ at 0.9/1 were brittle and had high offset voltage. Those which were prepared by controlling the $A_{In}/A_{Sb}$ at 1.8/1 were apparently not uniform and even contained at transparent area.

TABLE 2

| $A_{In}/A_{Sb}$ | $F_{In}/F_{Sb}$ | Mobility (cm$^2$/V · sec) |
|---|---|---|
| 0.9/1 | 0.8/1–1.0/1 | 2,200–5,000 |
| 1.8/1 | 1.6/1–1.9/1 | 2,700–6,100 |

Laue photographs were taken of the thin films of indium-antimony complex crystalline semiconductor that were prepared according to the process of the present invention and these films ($A_{In}/A_{Sb}$=0.9/1 and 1.8/1) which were prepared by not using the present invention. The first group of films had no characteristic ring, whereas the second group of films had a distinct ring. Clearly, the process of the present invention is very effective for use in industrial applications: as an immediate advantage, the film composition can be controlled by controlling the value of $A_{In}/A_{Sb}$, and as a secondary merit, the process is capable of making a thin semiconducting film whose mobility is sufficiently high for practical purposes and varies little from batch to batch.

EXAMPLES 4 TO 6

Vacuum deposition was effected as in Example 3 except that a sapphire (0001) substrate was used.

The sapphire substrate was subjected to the following preliminary treatment: its surface was treated with a 9:1 mixture of $H_2SO_4$ and $H_3PO_4$ at 80° C. for 2 hours, then immersed in 1N KOH, washed with water and dried. Immediately after the preliminary treatment, the substrate was mounted in a vacuum enclosure, and three groups of five thin films of indium-antimony complex crystalline semiconductor were prepared by controlling the value of $A_{In}/A_{Sb}$ to be at 1.2/1 (Example 4), 1.4/1 (Example 5) and 1.6/1 (Example 6), respectively. The mobilities of the respective groups of films are shown in Table 3 below.

TABLE 3

| Example No. | $A_{In}/A_{Sb}$ | Mobility (cm$^2$/V · sec) |
|---|---|---|
| 4 | 1.2/1 | 4,300–5,500 |
| 5 | 1.4/1 | 6,400–8,000 |
| 6 | 1.6/1 | 3,500–4,600 |

COMPARATIVE EXAMPLE 2

Thin films of indium-antimony complex crystalline semiconductor were prepared as in Example 3 except that a sapphire (0001) substrate was used. Vacuum deposition was conducted by controlling the $A_{In}/A_{Sb}$ at 0.95/1 and 1.8/1. Those films prepared by controlling the $A_{In}/A_{Sb}$ at 0.95/1 had the mobilities in the range of from 1,700 to 2,800 cm$^2$/V·sec, and those which were prepared by controlling the $A_{In}/A_{Sb}$ at 1.8/1 had the mobilities in the range of from 1,000 to 2,500 cm$^2$/V·sec.

EXAMPLE 7

A thin film of indium-antimony complex crystalline semiconductor having an $F_{In}/F_{Sb}$ of 1.54/1 was formed on a mica substrate as in Example 3. The film was then bonded to a ferrite plate, patterned, connected to electrodes, wire-bonded and moded to fabricate 340 Hall elements each measuring 3 mm long and 2.5 mm wide. The output voltages from the Hall elements were measured at a constant current of 5 mA or a constant voltage of 1 V, and in a magnetic field of 500 gauss. The results were: $V_{Hi}$=107.7±5.2 mV, $|V_{Hio}|$=3.5±3.0 mV, $V_{Hv}$=45.8±3.1 mV, and $|V_{Hvo}|$=2.0±1.8 mV. The $|V_{Hio}|$ and $|V_{Hvo}|$ were offset voltages as produced in the absence of magnetic field with a constant current and voltage applied, respectively.

COMPARATIVE EXAMPLE 3

A thin film of indium-antimony complex crystalline semiconductor having an $F_{In}/F_{Sb}$ of 1.04/1 was formed on a mica substrate as in Example 3, and Hall elements were fabricated from the film as in Example 7. The output voltages from the respective samples were measured as in Example 7, and the results were:

$V_{Hi}$=11.3±7.8 mV, $|V_{Hio}|$=6.8±4.2 mV, $V_{Hv}$=5.6±3.7 mV, $|V_{Hvo}|$=2.5±1.4 mV.

EXAMPLE 8

A vacuum deposition apparatus having a rotary substrate holder capable of supporting six wafers on the circumference was used. A mica substrate was used, and its temperature was detected by a Pt-Rh thermocouple positioned 10 mm above each wafer. Another thermocouple was positioned above each wafer but at different heights for controlling the substrate temperature. Since the detected substrate temperature differs from the actual substrate temperature, it was corrected for the value of the stationary holder. The values of the substrate temperature indicated in the following examples are those after correction by this method. Elemental indium and antimony to be deposited were 6-N of Furuuchi Chemical Co., Ltd. Six thin semiconducting films were formed at degree of vacuum of $1 \times 10^{-6}$ Torr; the substrate temperature was preset at 380° C., and indium and antimony were vaporized so that the $A_{In}/A_{Sb}$ was controlled at 1.45/1, and a deposited film having a thickness of 1.1μ was formed in a period of 30 minutes, during which the substrate temperature was increased to 460° C. The six wafers were patterned as shown in FIG. 1 and their characteristics were measured: the mobility was between 23,000 and 24,500 cm²/V·sec and the Hall coefficient was as high as 390 to 420 cm³/C. All films had high gloss.

EXAMPLE 9

Thin semiconducting films were prepared by vacuum deposition as in Example 8 except that the substrate temperature was held at 420° C. The films had the mobilities of 17,100 to 18,900 cm²/V·sec, and the Hall coefficients of 270 to 280 cm³/C.

EXAMPLE 10

Thin semiconducting films were prepared as in Example 8 except that the substrate temperature was preset at 480° C. that was higher than the limiting temperature of the substrate. The average mobility of the films was 3,000 cm²/V·sec, and the Hall coefficient was between 230 and 250 cm³/C. The films were non-glossy and had great offset voltage.

EXAMPLES 11 TO 13

Three groups of thin conducting films were prepared as in Example 8 except that the $A_{In}/A_{Sb}$ was varied to 1.15/1 (Example 11), 1.3/1 (Example 12) and 1.6/1 (Example 13). The mobility data for the three examples is given in Table 4 below.

TABLE 4

| Example No. | $A_{In}/A_{Sb}$ | Mobility (cm²/V · sec) |
|---|---|---|
| 11 | 1.15/1 | 17,000–18,800 |
| 12 | 1.3/1 | 22,500–23,000 |
| 13 | 1.6/1 | 19,200–20,700 |

COMPARATIVE EXAMPLE 4

Thin films of indium-antimony compound semiconductor were prepared as in Example 8 except that the $A_{In}/A_{Sb}$ was controlled to be at 0.9/1 and 1.8/1. Boty types of films had a mobility much lower than 10,000 cm²/V·sec: the first type ($A_{In}/A_{Sb}=0.9/1$) had an average mobility of 6,000 cm²/V·sec, and the second type ($A_{In}/A_{Sb}=1.8/1$) had an average of 3,000 cm²/V·sec. The first type of films had large offset voltage, and the second type of films were not uniform and had pinholes here and there.

EXAMPLES 14 TO 17

Thin semiconducting films were prepared by vacuum deposition as in Example 8 by controlling the $A_{In}/A_{Sb}$ at 1.45/1 except that the degree of vacuum was held at $8 \times 10^{-7}$ Torr and the final substrate temperature was 480° C. whilst the initial substrate temperatures were 400° C. (Example 14), 420° C. (Example 15), 440° C. (Example 16) and 470° C. (Example 17), respectively. The results are shown in Table 5 below.

TABLE 5

| Example No. | Initial Substrate Temperature (°C.) | Average Mobility (cm²/V · sec) for the Six Films |
|---|---|---|
| 14 | 400 | 24,500 |
| 15 | 420 | 22,000 |
| 16 | 440 | 16,200 |
| 17 | 470 | 4,800 |

EXAMPLES 18 TO 21

Thin semiconducting films were prepared as in Example 8 except that the substrate temperature was held at the average substrate temperatures in Examples 14 to 17, i.e., 440° C. (Example 18), 450° C. (Example 19), 460° C. (Example 20) and 475° C. (Example 21). The results are shown in Table 6 below.

TABLE 6

| Example No. | Substrate Temperature (°C.) | Average Mobility (cm²/V · sec) for the Six Films |
|---|---|---|
| 18 | 440 | 21,300 |
| 19 | 450 | 18,700 |
| 20 | 460 | 7,900 |
| 21 | 475 | 3,500 |

EXAMPLE 22

Six wafers of indium-antimony semiconductor were prepared using the same apparatus, substrate and vaporizable materials as in Example 8. First, the degree of vacuum and the substrate temperature were preset at $1 \times 10^{-6}$ Torr and 400° C., respectively. Then, the needle valve was opened to introduce nitrogen gas to increase the pressure to $1 \times 10^{-4}$ Torr. Elemental indium and antimony were vaporized in such a manner that the $A_{In}/A_{Sb}$ was held at 1.4/1, and thin films each having a thickness of 1.1 μm were formed over a period of 30 minutes, during which the substrate temperature was elevated to 480° C. and nitrogen gas was continuously supplied through the needle valve. The resulting six wafers were patterned as depicted in FIG. 1, and their mobility was measured. The result was: 29,800–32,500 cm²/V·sec.

EXAMPLE 23

Thin semiconducting films were prepared as in Example 22 except that the substrate temperature was held at 440° C. The films had the mobilities of from 24,400 to 26,200 cm²/V·sec.

EXAMPLES 24 TO 26

Three groups of thin semiconducting films were prepared using the same apparatus, substrate and vaporizable material as in Example 8. First, the degree of vacuum and the substrate temperature were preset at $1\times10^{-6}$ Torr and 400° C., respectively. Then, the needle valve was opened to introduce nitrogen gas to increase the pressure to $7\times10^{-5}$ Torr. Elemental indium and antimony were vaporized and condensed on the substrate to form a film about 1 μm thick over a period of 30 minutes while the substrate temperature was elevated to 500° C. and nitrogen gas was continuously supplied through the needle valve. The rate of increasing the substrate temperature in the period of vacuum deposition was as follows: 1°–2° C./min for the first 10 minutes, from 12 to 20 minutes, and from 22 to 30 minutes; 12°–14° C./min from 10 to 12 minutes; and 6°–7° C./min from 20 to 22 minutes. During the vacuum deposition, the $A_{In}/A_{Sb}$ was controlled to be at 1.20/1 (Example 24), 1.41/1 (Example 25) and 1.53/1 (Example 26). The mobility data for the resulting films is given in Table 7 below.

TABLE 7

| Example No. | $A_{In}/A_{Sb}$ | Mobility ($cm^2/V \cdot sec$) |
|---|---|---|
| 24 | 1.20/1 | 24,800–25,700 |
| 25 | 1.41/1 | 29,600–30,000 |
| 26 | 1.53/1 | 25,900–27,100 |

EXAMPLE 27

A vacuum deposition apparatus having a rotary substrate holder capable of supporting six wafers on the circumference was used. The substrate temperature was detected by three Pt-Rh thermocouples located 10 mm above the wafers, and the average of the detected values was taken. Two other thermocouples were located for the control of the substrate temperature: one was positioned 5 mm above the wafers, and the other 15 mm above. The degree of vacuum was measured with a B-A gauge inserted into a pipe connecting the bell jar and the evacuating device. A mica plate was used as substrate and elemental indium and antimony, 6-N, of Furuuchi Chemical Co., Ltd. were used as vaporizable materials. First, the pressure in the bell jar was reduced to $1.5\times10^{-6}$ Torr, and the substrate temperature was preset at 395° C. Power was supplied to the indium and antimony boats so that the $A_{In}/A_{Sb}$ was held at 0.6/1 for the first 8 minutes, and at 1.40/1 for the remaining period of the vacuum deposition. The vacuum deposition was continued for 40 minutes until the film thickness became 1.2 μm. The final substrate temperature was 500° C. After the deposition, the average $A_{In}/A_{Sb}$ was calculated from the amounts of indium and antimony vaporized, and was found to be 1.35/1. The six wafers were patterned as depicted in FIG. 1 and their characteristics were measured: the Hall coefficient was between 330 and 390 $cm^3/C.$, and the mobility was between 49,200 and 55,700 $cm^2/V \cdot sec$. The wafers had whitish silver gloss, and were comprised of crystal grains of a size of several hundred microns which were visible to the naked eye.

EXAMPLE 28

Thin semiconducting films were prepared as in Example 27 except that power was supplied to the indium and antimony boats so that the $A_{In}/A_{Sb}$ was held at 1.30/1 throughout the period of vacuum deposition. The films had no crystal grain and had a mobility between 19,000 and 23,600 $cm^2/V \cdot sec$.

EXAMPLE 29

Thin semiconducting films were prepared as in Example 27 except that the initial substrate temperature was 370° C. The average value of $A_{In}/A_{Sb}$ was 1.32/1, and the films obtained had mobilities in the range of from 23,300 to 23,800 $cm^2/V \cdot sec$.

EXAMPLE 30

Six wafers of indium-antimony semiconductor were prepared using the same apparatus, substrate and vaporizable materials as in Example 27. First, the pressure in the bell jar was reduced to $2\times10^{-6}$ Torr, then the needle valve was opened to introduce 4-N nitrogen gas to increase the pressure of $5\times10^{-5}$ Torr. Then, the substrate temperature was preset at 420° C., and the power supplied to the indium and antimony boats was so controlled that the $A_{In}/A_{Sb}$ was held at 1.0/1 or less for the first 8 minutes, and at 1.30/1 for the remaining period. The vacuum deposition was continued for 30 minutes until the film thickness became 0.9 μm. Nitrogen gas was supplied throughout the period of the deposition. The final substrate temperature was 510° C., and the average $A_{In}/A_{Sb}$ was 1.23/1. Four samples of semiconductor element having the pattern of FIG. 1 were made from each wafer, and their characteristics were measured: the Hall coefficient was between 380 and 450 $cm^3/C.$ and the mobility was between 54,300 and 61,400 $cm^2/V \cdot sec$. The wafers had silver white gloss and were comprised of crystal grains of a size of several millimeters and having a hexagonal section. X-ray diffractometry gave a strong diffraction line for both indium-antimony compound (111) and indium crystal (101). The $F_{In}/F_{Sb}$ values of the films as measured by atomic absorption spectroscopy were in the range of from 1.18/1 to 1.24/1.

EXAMPLE 31

Thin semiconducting films were prepared by vacuum deposition as in Example 30 except that the initial substrate temperature was 445° C. The resulting films had crystalline areas and transparent areas. The variation in the amount of deposition on the substrate was as great as 20% or more. The mobility of the films varied over a fairly wide range of from 21,700 to 48,000 $cm^2/V \cdot sec$.

EXAMPLE 32

Thin semiconducting films were prepared by vacuum deposition as in Example 30 except that the initial substrate temperature was 405° C. The resulting films were bluish. Their mobility was in the range of from 14,500 to 17,000 $cm^2/V \cdot sec$.

EXAMPLE 33

Thin semiconducting films were prepared by vacuum deposition as in Example 30 except that the 4-N nitrogen gas was replaced by 4-N argon gas. The average value of $A_{In}/A_{Sb}$ was 1.20/1. The mobility of the films was between 37,000 and 46,000 $cm^2/V \cdot sec$.

EXAMPLE 34

Six thin films of indium-antimony semiconductor were prepared by using the same apparatus, substrate and vaporizable materials as in Example 27. The bell jar was supplied with 4-N nitrogen gas until the pressure in the bell jar was $8\times10^{-5}$ Torr. The substrate temperature was initially set at 425° C., and the power supplied to the indium and antimony boats was so controlled that the $A_{In}/A_{Sb}$ was held at 1.0/1 or less for the first 5 minutes and at 1.45/1 for the remaining period. The deposition of indium and antimony vapors was continued for 30 minutes until the film thickness became 1.0 μm. The final substrate temperature was 515° C., and the average value of $A_{In}/A_{Sb}$ was 1.38/1. The six wafers were patterned as shown in FIG. 1 and their characteristics were measured: the Hall coefficient was between 360 and 430 $cm^3$/C., and the mobility was between 48,700 and 56,600 $cm^2$/V·sec.

While the invention has been described in detail and with reference to specific embodiments thereof, it will be apparent to one skilled in the art that various changes and modifications can be made therein without departing from the spirit and scope thereof.

What is claimed is:

1. An indium-antimony complex crystalline semiconductor consisting essentially of crystals of an indium-antimony compound and crystals of indium alone, wherein the atomic ratio of the total indium content to the antimony content is in the range of from 1.1/1 to 1.7/1.

2. An indium-antimony complex crystalline semiconductor according to claim 1, which is in the form of a thin film.

3. An indium-antimony complex crystalline semiconductor as in claim 1, wherein the ratio of total indium content to the antimony content is in the range of from 1.2/1 to 1.6/1.

4. An indium-antimony complex crystalline semiconductor as in claim 2, wherein the ratio of total indium content to the antimony content is in the range of from 1.2/1 to 1.6/1.

* * * * *